US011411068B2

(12) United States Patent
Park

(10) Patent No.: US 11,411,068 B2
(45) Date of Patent: Aug. 9, 2022

(54) SEMICONDUCTOR PACKAGES INCLUDING INDUCTOR STRUCTURES

(71) Applicant: Samsung Electronics Co., Ltd., Suwon-si (KR)

(72) Inventor: Sangwook Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/126,939

(22) Filed: Dec. 18, 2020

(65) Prior Publication Data

US 2021/0391411 A1 Dec. 16, 2021

(30) Foreign Application Priority Data

Jun. 10, 2020 (KR) ........................ 10-2020-0070151

(51) Int. Cl.
*H01L 23/522* (2006.01)
*H01L 23/00* (2006.01)
*H01L 49/02* (2006.01)
*H01F 5/00* (2006.01)
*H01L 23/538* (2006.01)

(52) U.S. Cl.
CPC ............ *H01L 28/10* (2013.01); *H01F 5/003* (2013.01); *H01L 23/5227* (2013.01); *H01L 23/5386* (2013.01); *H01L 24/81* (2013.01)

(58) Field of Classification Search
CPC . H01L 28/10; H01L 23/5227; H01L 23/5386; H01L 23/49816; H01L 23/49822; H01F 5/003; H01F 17/0013

USPC .......................................... 257/531; 438/957
See application file for complete search history.

(56) References Cited

U.S. PATENT DOCUMENTS

| | | | |
|---|---|---|---|
| 7,619,296 B2 | 11/2009 | Nakashiba | |
| 7,907,043 B2 | 3/2011 | Mori | |
| 7,955,886 B2 | 6/2011 | Marques | |
| 8,212,155 B1 | 7/2012 | Wright et al. | |
| 9,831,198 B2 | 11/2017 | Zhou et al. | |
| 9,842,680 B2 | 12/2017 | Kim et al. | |
| 2014/0246753 A1* | 9/2014 | Song et al. | ......... H01L 23/5227 257/531 |
| 2020/0005980 A1 | 1/2020 | Dong | |

* cited by examiner

*Primary Examiner* — Thinh T Nguyen
(74) *Attorney, Agent, or Firm* — Harness, Dickey & Pierce, P.L.C.

(57) ABSTRACT

A semiconductor package may include a substrate, including an inductor array including inductor structures, and a semiconductor chip and a voltage regulator each on the substrate. Each of the inductor structures may include an input terminal, an output terminal, a coil between the input terminal and the output terminal, and conductive wirings. The inductor structures may be apart from one another in a second horizontal direction. Each of the coils may include a lower horizontal winding wound horizontally, an upper horizontal winding wound horizontally, and a conductive via. In a plan view, the coils may be arranged in zigzags, and the coils and the conductive wirings may be alternately arranged in the second horizontal direction.

20 Claims, 13 Drawing Sheets

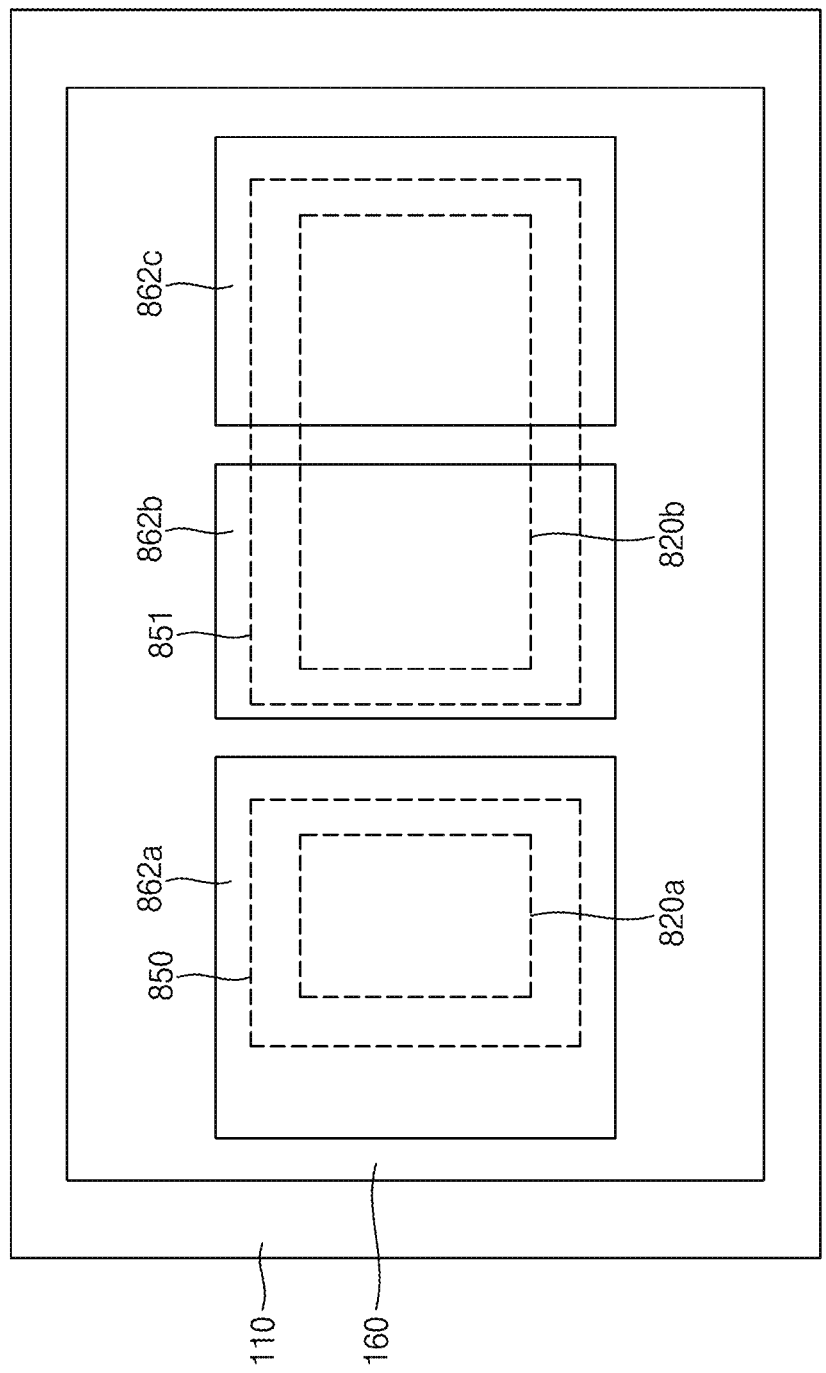

SEMICONDUCTOR PACKAGES INCLUDING INDUCTOR STRUCTURES

CROSS-REFERENCE TO THE RELATED APPLICATION

This application claims the benefit of Korean Patent Application No. 10-2020-0070151, filed on Jun. 10, 2020, in the Korean Intellectual Property Office, the disclosure of which is incorporated herein by reference in its entirety.

BACKGROUND

1. Field

The inventive concepts relate to a semiconductor package including an inductor structure.

2. Description of the Related Art

As the demand for more highly integrated and/or more miniaturized semiconductor devices increases, a size of each semiconductor device is progressively miniaturized. In inductors applied to mobile devices, it may be important to decrease a size and/or supply a constant current.

SUMMARY

The example embodiments of the disclosure provide a semiconductor package including an inductor structure.

A semiconductor package in accordance with example embodiments of the disclosure may include a substrate, including an inductor array including inductor structures extending in a first horizontal direction, and a semiconductor chip and a voltage regulator each on the substrate. Each of the inductor structures may include an input terminal, an output terminal, a coil between the input terminal and the output terminal, and conductive wirings connecting the coil to the input terminal and the output terminal. The inductor structures may be apart from one another in a second horizontal direction intersecting with the first horizontal direction. Each of the coils may include a lower horizontal winding wound horizontally, an upper horizontal winding wound horizontally, and a conductive via extending in a vertical direction and connecting the lower horizontal winding to the upper horizontal winding. In a plan view, the coils may be arranged in zigzags, and the coils and the conductive wirings may be alternately arranged in the second horizontal direction.

A semiconductor package in accordance with example embodiments of the disclosure may include a substrate including an inductor array including first inductor structures and second inductor structures each extending in a first horizontal direction, the first inductor structures and the second inductor structures being apart from one another in a second horizontal direction intersecting with the first horizontal direction, and a semiconductor chip and a voltage regulator each on the substrate. Each of the first inductor structures and the second inductor structures may include an input terminal, an output terminal, a first coil and a second coil between the input terminal and the output terminal, and conductive wirings connecting the first coil, the second coil, the input terminal, and the output terminal. Each of the first coil and the second coil may include a lower horizontal winding wound horizontally, an upper horizontal winding wound horizontally, and a conductive via extending in a vertical direction and connecting the lower horizontal winding to the upper horizontal winding. In a plan view, the first coils and the second coils may be arranged in zigzags, and the first coils, the second coils, and the conductive wirings may be alternately arranged in the second horizontal direction.

A semiconductor package in accordance with example embodiments of the disclosure may include a substrate including lower pads, upper pads, and an inductor array including inductor structures extending in a first horizontal direction, a semiconductor chip on the substrate and electrically connected to the upper pads, and external connection terminals and a voltage regulator each under the substrate, the external connection terminals being electrically connected to the voltage regulator through the lower pads. Each of the inductor structures may include an input terminal, an output terminal, a coil between the input terminal and the output terminal, and conductive wirings connecting the coil to the input terminal and the output terminal. The inductor structures may be apart from one another in a second horizontal direction intersecting with the first horizontal direction. Each of the coils may include a lower horizontal winding wound horizontally, an upper horizontal winding wound horizontally, and a conductive via extending in a vertical direction and connecting the lower horizontal winding to the upper horizontal winding. In a plan view, the coils may be arranged in zigzags, and the coils and the conductive wirings may be alternately arranged in the second horizontal direction.

BRIEF DESCRIPTION OF THE DRAWINGS

FIGS. 13 and 14 are layouts of a semiconductor package according to example embodiments of the inventive concepts.

DETAILED DESCRIPTION OF EXAMPLE EMBODIMENTS

Figure 1:
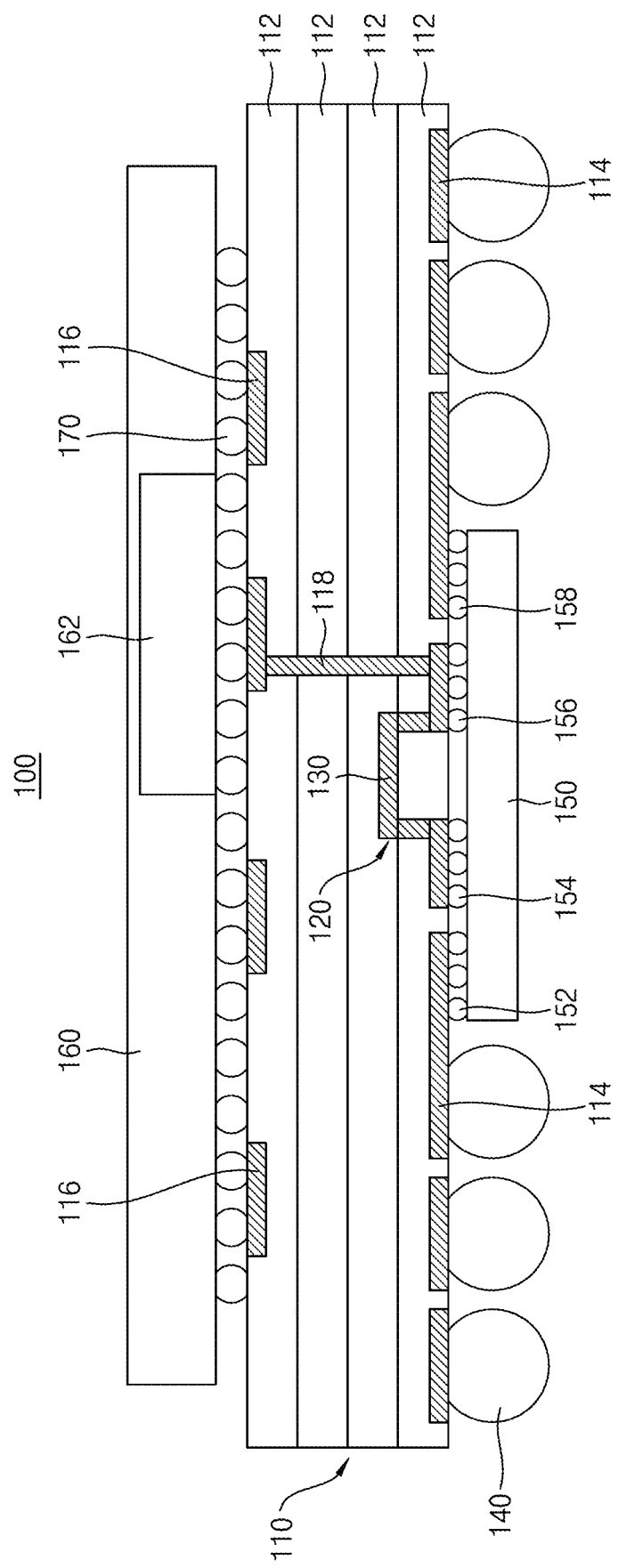
FIG. 1 is a cross-sectional view of a semiconductor package according to example embodiments of the inventive concepts.
Figure 2:
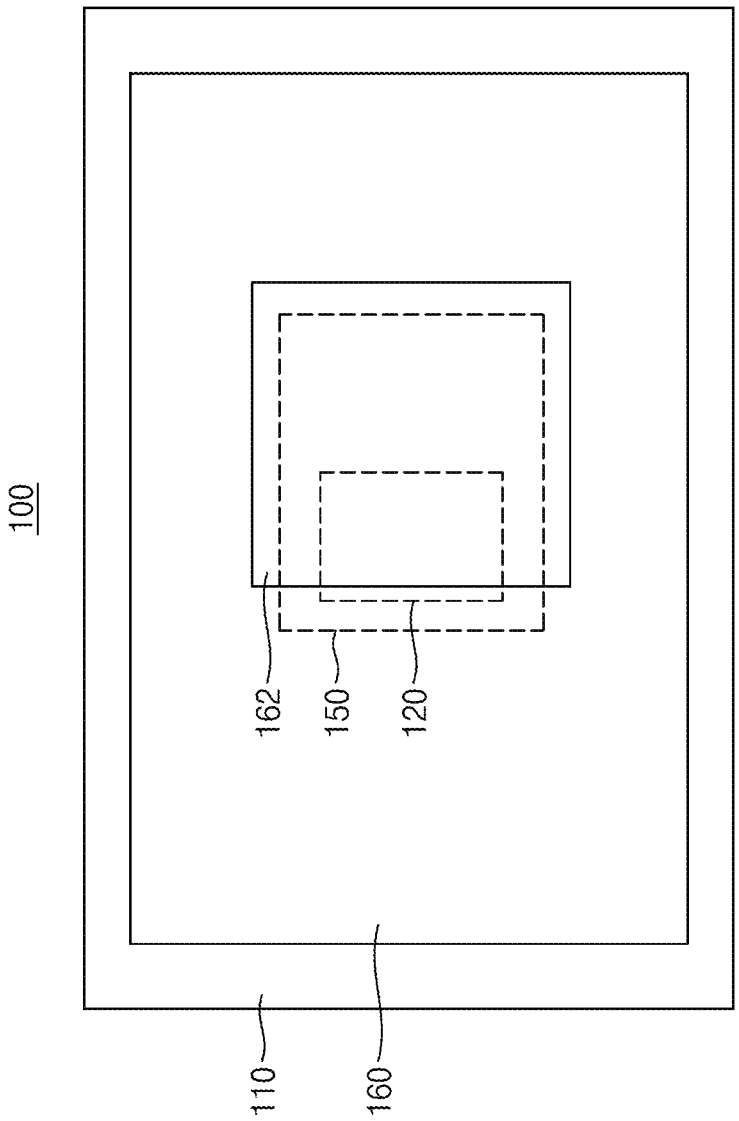
FIG. 2 is a layout of the semiconductor package illustrated in FIG. 1.

FIG. 1 is a cross-sectional view of a semiconductor package 100 according to example embodiments of the inventive concepts. FIG. 2 is a layout of the semiconductor package 100 illustrated in FIG. 1.

Referring to FIGS. 1 and 2, the semiconductor package 100 may include a substrate 110, an inductor array 120, an external connection terminal 140, a voltage regulator 150, a semiconductor chip 160, and/or a bump 170.

The substrate 110 may include a plurality of insulation layers 112, a plurality of lower pads 114, a plurality of upper pads 116, an internal via 118, and/or the inductor array 120. The plurality of insulation layers 112 may be vertically stacked. In some example embodiments, the substrate 110 may include four insulation layers 112.

The plurality of insulation layers 112 may include a thermosetting resin such as an epoxy resin, a thermoplastic resin such as polyimide, or a resin (for example, prepreg, Ajinomoto build-up film (ABF), FR-4, bismaleimide triazine (BT) or a photo imageable dielectric (PID) resin) including a reinforcing agent such as glass cloth and/or an inorganic filler.

The plurality of lower pads 114 may be disposed on a bottom surface of the substrate 110, and the plurality of upper pads 116 may be disposed on a top surface of the substrate 110. The plurality of lower pads 114 and the plurality of upper pads 116 may include metal such as aluminum (Al), titanium (Ti), chromium (Cr), iron (Fe), cobalt (Co), copper (Cu), nickel (Ni), zinc (Zn), palladium (Pd), platinum (Pt), gold (Au), and/or silver (Ag).

The internal via 118 may vertically pass through the substrate 110. The internal via 118 may electrically connect the inductor array 120 to a corresponding upper pad 116 of the plurality of upper pads 116. The internal via 118 may include metal such as Al, Ti, Cr, Fe, Co, Ni, Cu, Zn, Pd, Pt, Au, and/or Ag.

The inductor array 120 may be disposed in the substrate 110 and may include at least one inductor structure 130. For example, the inductor array 120 may be disposed under the substrate 110. The inductor array 120 may be used to transfer power to the semiconductor chip 160. In some example embodiments, the inductor array 120 may adjust a current transferred to the semiconductor chip 160.

The external connection terminal 140 may be provided in plural, and the plurality of external connection terminals 140 may be disposed on the bottom surface of the substrate 110. The plurality of external connection terminals 140 may be electrically connected to the plurality of lower pads 114. Each of the plurality of external connection terminals 140 may be a solder ball.

The voltage regulator 150 may be disposed on the bottom surface of the substrate 110. For example, the voltage regulator 150 may be disposed between the plurality of external connection terminals 140, and a bottom surface of the voltage regulator 150 may be disposed at a level which is higher than a lower end of each of the plurality of external connection terminals 140.

The voltage regulator 150 may include a first connection member 152, a second connection member 154, a third connection member 156, and/or a fourth connection member 158. The voltage regulator 150 may be attached on the substrate 110 by the first connection member 152, the second connection member 154, the third connection member 156, and/or the fourth connection member 158. Each of the first connection member 152, the second connection member 154, the third connection member 156, and/or the fourth connection member 158 may be electrically connected to one of the plurality of lower pads 114. For example, the first connection member 152 may be electrically connected to the external connection terminal 140 through a corresponding lower pad 114. The second connection member 154 and the third connection member 156 may be electrically connected to the inductor array 120. The fourth connection member 158 may be electrically connected to the external connection terminal 140 through a corresponding lower pad 114. Each of the first connection member 152, the second connection member 154, the third connection member 156, and/or the fourth connection member 158 may include a solder.

The inductor array 120 and the voltage regulator 150 may adjust power transferred to the semiconductor chip 160. Power input from the external connection terminal 140 may be transferred to the voltage regulator 150 through the first connection member 152 and a corresponding lower pad 114. The voltage regulator 150 may adjust the power to be suitable for driving of the semiconductor chip 160 and may transfer the adjusted power to the inductor array 120 through the second connection member 154. The power output from the inductor array may be transferred to the voltage regulator 150 through the third connection member 156 and may be transferred to the semiconductor chip 160 through the internal via 118 and a corresponding upper pad 116. In some example embodiments, the power output from the inductor array 120 may be transferred to the semiconductor chip 160 through the internal via 118 and a corresponding upper pad 116 without passing through the voltage regulator 150. In some example embodiments, the inductor regulator may decrease a variation of a level of a current of power.

The semiconductor chip 160 may be disposed on the substrate 110. In some example embodiments, the semiconductor chip 160 may be a system-on chip (SoC). An integrated circuit of the SoC may include various cores 162 such as a microprocessor, an interface, a memory array, and/or a digital signal processor (DSP). In some example embodiments, one of the cores 162 may be a central processing unit (CPU).

The bump 170 may be disposed between the substrate 110 and the semiconductor chip 160. The semiconductor chip 160 may be attached on the substrate 110 by the bump 170.

Figure 3:
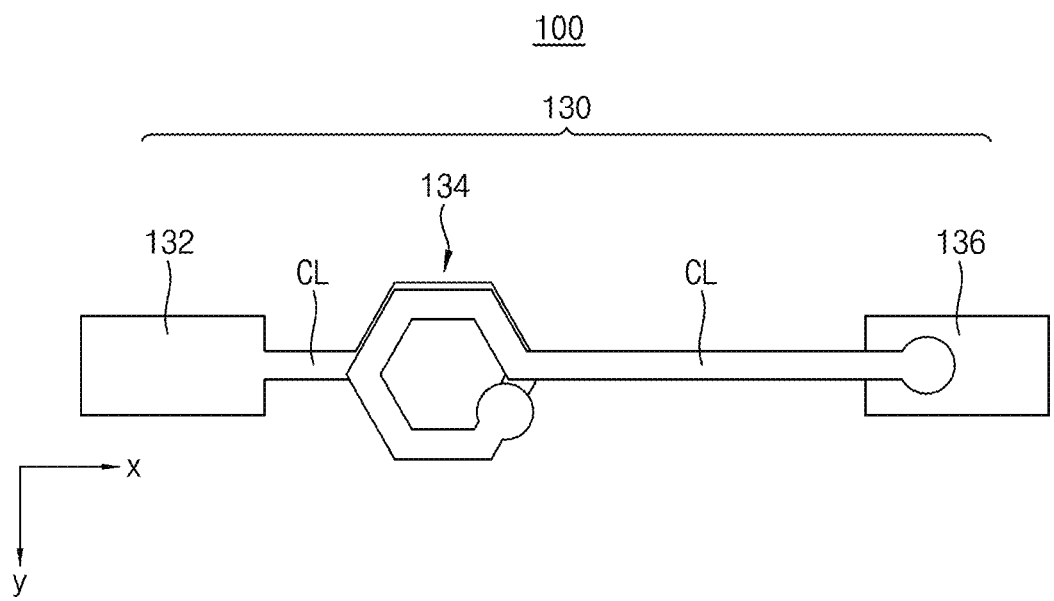
FIG. 3 is a plan view illustrating an inductor structure of a semiconductor package according to example embodiments of the inventive concepts.
Figure 4:
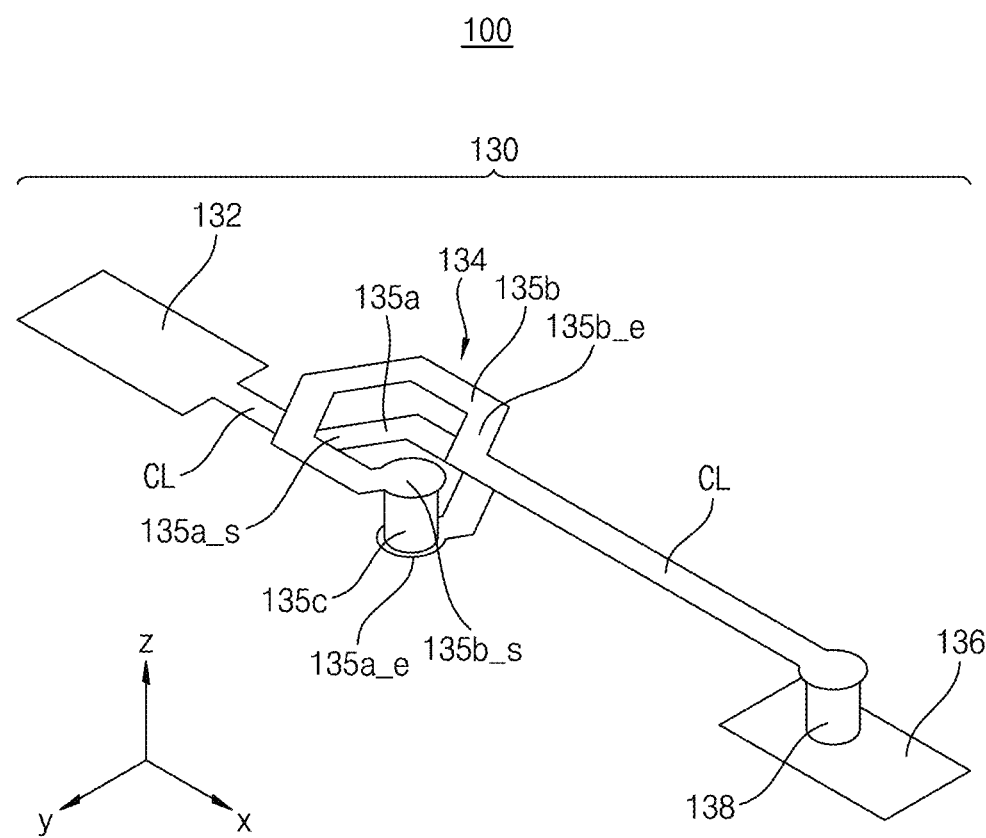
FIG. 4 is a perspective view of the inductor structure illustrated in FIG. 3.

FIG. 3 is a plan view illustrating an inductor structure of a semiconductor package according to example embodiments of the inventive concepts. FIG. 4 is a perspective view of the inductor structure illustrated in FIG. 3.

The inductor structure 130 may include an input terminal 132, a coil 134, an output terminal 136, an output via 138, and/or a plurality of conductive wirings CL. Referring again to FIG. 1, the input terminal 132 may be electrically connected to the second connection member 154. In some example embodiments, the input terminal 132 may be electrically connected to a plurality of second connection members 154. The input terminal 132 may be disposed on the bottom surface of the substrate 110, and for example, a bottom surface of the input terminal 132 may be exposed to contact the second connection member 154.

In some example embodiments, the inductor structure 130 may extend in a first horizontal direction x. For example, the input terminal 132, the coil 134, and the output terminal 136 may be disposed apart from one another in the first horizontal direction x, and the plurality of conductive wirings CL may extend in the first horizontal direction x.

The coil 134 may include a lower horizontal winding 135a, an upper horizontal winding 135b, and/or a conductive via 135c. The lower horizontal winding 135a may be horizontally wound. For example, a start portion 135a_s and an end portion 135a_e of the lower horizontal winding 135a may be disposed on the same plane, and the lower horizontal winding 135a may extend in a horizontal direction. In some example embodiments, the lower horizontal winding 135a may extend clockwise or counterclockwise. The lower horizontal winding 135a may be connected to the input terminal 132 through a corresponding conductive wiring CL. For example, the start portion 135a_s of the lower horizontal winding 135a may be connected to a corresponding conductive wiring CL. A top surface of the input terminal 132 and a top surface of the lower horizontal winding 135a may be disposed at the same level.

The upper horizontal winding 135b may be disposed on the lower horizontal winding 135a and may overlap the lower horizontal winding 135a in a vertical direction z. The upper horizontal winding 135b may be horizontally wound. For example, a start portion 135b_s and an end portion 135b_e of the upper horizontal winding 135b may be disposed on the same plane, and the upper horizontal winding 135b may extend in a horizontal direction. In some example embodiments, the upper horizontal winding 135b may extend in the same direction (for example, a clockwise or counterclockwise direction) as that of the lower horizontal winding 135a. The upper horizontal winding 135b may be connected to the lower horizontal winding 135a through the conductive via 135c. For example, the end portion 135a_e of the lower horizontal winding 135a and the start portion 135b_s of the upper horizontal winding 135b may overlap each other in the vertical direction z and may be connected to each other through the conductive via 135c extending in the vertical direction z.

In some example embodiments, the coil 134 may be hexagonal in shape. For example, the lower horizontal winding 135a and the upper horizontal winding 135b may have a regular hexagonal shape and may extend clockwise or counterclockwise.

The output terminal 136 may be connected to the upper horizontal winding 135b through the output via 138 and a corresponding conductive wiring CL. The output via 138 may extend in the vertical direction z and may connect the output terminal 136 to a corresponding conductive wiring CL. The end portion 135b_e of the upper horizontal winding 135b may be connected to the output via 138 through a corresponding conductive wiring CL. The output terminal 136 may be disposed at a level which is lower than the upper horizontal winding 135b. In some example embodiments, a top surface of the output terminal 136 may be disposed at the same level as top surfaces of the input terminal 132 and the lower horizontal winding 135a.

In FIG. 4, the input terminal 132, the coil 134, the output terminal 136, and the conductive wirings CL are illustrated in a shape corresponding to a sheet, but each of the elements may have a certain thickness in the vertical direction z. The input terminal 132, the coil 134, the output terminal 136, the output via 138, and/or the conductive wirings CL may include metal such as copper.

Figure 5:
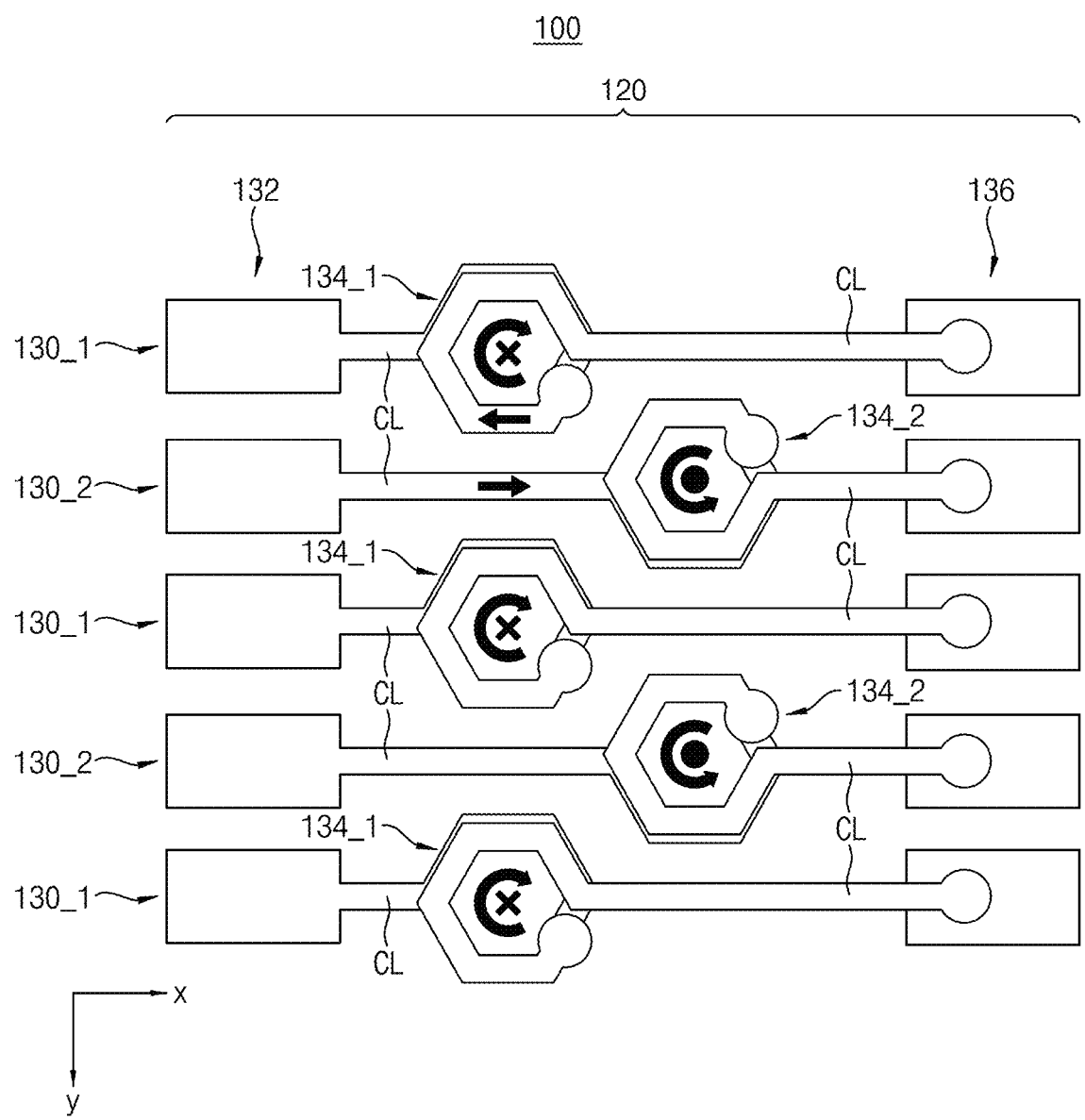
FIG. 5 is a plan view of an inductor array of a semiconductor package according to example embodiments of the inventive concepts.
Figure 6:
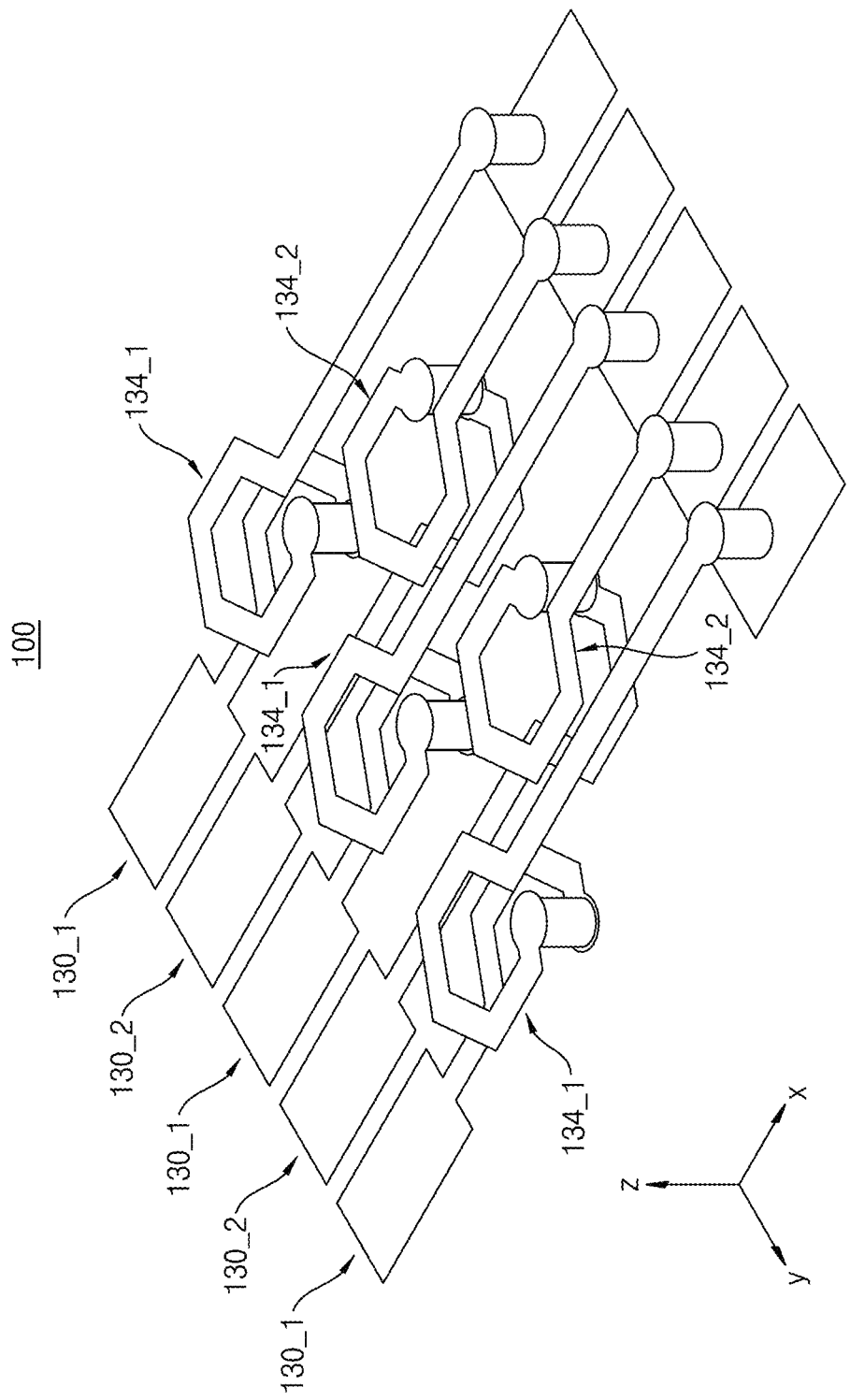
FIG. 6 is a perspective view of the inductor array illustrated in FIG. 5.

FIG. 5 is a plan view of an inductor array 120 of a semiconductor package according to example embodiments of the inventive concepts. FIG. 6 is a perspective view of the inductor array 120 illustrated in FIG. 5.

Referring to FIGS. 5 and 6, as described above, the inductor array 120 may include a plurality of inductor structures. In some example embodiments, the inductor array 120 may include a plurality of first inductor structures 130_1 and a plurality of second inductor structures 130_2. The plurality of first inductor structures 130_1 and the plurality of second inductor structures 130_2 may each include elements which are the same as or similar to those of the inductor structure 130 illustrated in FIGS. 3 and 4. In FIGS. 5 and 6, five inductor structures are illustrated, but the present example embodiments are not limited thereto. In some example embodiments, the inductor array 120 may include two to four inductor structures, or may include more inductor structures than five.

The plurality of first inductor structures 130_1 and the plurality of second inductor structures 130_2 may each extend in a first horizontal direction x. The plurality of first inductor structures 130_1 and the plurality of second inductor structures 130_2 may be apart from one another in a second horizontal direction y. In some example embodiments, the plurality of first inductor structures 130_1 and the plurality of second inductor structures 130_2 may be alternately arranged in the second horizontal direction y. Each of the plurality of first inductor structures 130_1 may include a first coil 134_1, and each of the plurality of second inductor structures 130_2 may include a second coil 134_2. Each of the first coil 134_1 and the second coil 134_2 may be a clockwise coil 134 or a counterclockwise coil 134. Here, as seen in a plan view, the clockwise coil may denote a coil 134 which is wound in a clockwise direction, and the counterclockwise coil may denote a coil 134 which is wound in a counterclockwise direction. In some example embodiments, the first coils 134_1 may be clockwise coils, and the second coils 134_2 may be counterclockwise coils. Each of the first coils 134_1 may be connected to a conductive wiring CL disposed at a left side and a conductive wiring CL disposed at a right side, and each of the second coils 134_2 may be connected to a conductive wiring CL disposed at a left side and a conductive wiring CL disposed at a right side.

The first coils 134_1 may be apart from one another in the second horizontal direction y, and the second coils 134_2 may be apart from one another in the second horizontal direction y. In some example embodiments, as seen in a plan view, the first coils 134_1 and the second coils 134_2 may be arranged in zigzags (for example, offset from each other in at least two directions). For example, the first coils 134_1 and the second coils 134_2 may be apart from one another in the first horizontal direction x. Therefore, the first coils 134_2 and the conductive wirings CL may be alternately arranged in the second horizontal direction y, and the second coils 134_2 and the conductive wirings CL may be alternately arranged in the second horizontal direction y. As illustrated in FIG. 5, the first coils 134_1 and the second coils 134_2 each having a regular hexagonal shape may be arranged in zigzags, and thus, a length of each of the first and second inductor structures 130_1 and 130_2 in the first horizontal direction x may be reduced. Accordingly, a size of the inductor array 120 may be more reduced.

Power may be transferred from input terminals of the first and second inductor structures 130_1 and 130_2 to output terminals of the first and second inductor structures 130_1 and 130_2.

A level of a current, maximally transferred by each of the first and second inductor structures 130_1 and 130_2, may be defined, and power needed for the semiconductor chip 160 may vary. When power is being transferred to the semiconductor chip 160, all of the first and second inductor structures 130_1 and 130_2 of the inductor array 120 may not be used.

A current flowing in the plurality of first inductor structures 130_1 and a current flowing in the plurality of second inductor structures 130_2 may be affected by each other. For example, when a current flows in each of the plurality of first inductor structures 130_1, a magnetic field generated by the conductive coil CL and the first coil 134_1 of each of the plurality of first inductor structures 130_1 may cause an induced current to generate in a corresponding second inductor structure 130_2. Therefore, due to an induced current between each of the first inductor structure 130_1 and a corresponding second inductor structure 130_2, a variation range of a current may increase, and it may be difficult to transfer a current having a certain level.

As illustrated in FIG. 5, the f first coils 134_1 and the second coils 134_2 according to example embodiments of the disclosure may be arranged in zigzags, and thus, the inductor array 120 may decrease a mutual inductance of each of the first inductor structures 130_1 and the second inductor structures 130_2. For example, when it is assumed that a current flows from the input terminal 132 to the output terminal 136, a current direction (a −x direction) based on an upper first coil 134_1 among the first coils 134_1 illustrated in FIG. 5 may be opposite to a current direction (a +x direction) of a conductive wiring CL adjacent thereto in the second horizontal direction y. Accordingly, the first coils 134_1 and the conductive wirings CL alternately arranged in the second horizontal direction y may decrease a mutual inductance.

Figure 7:
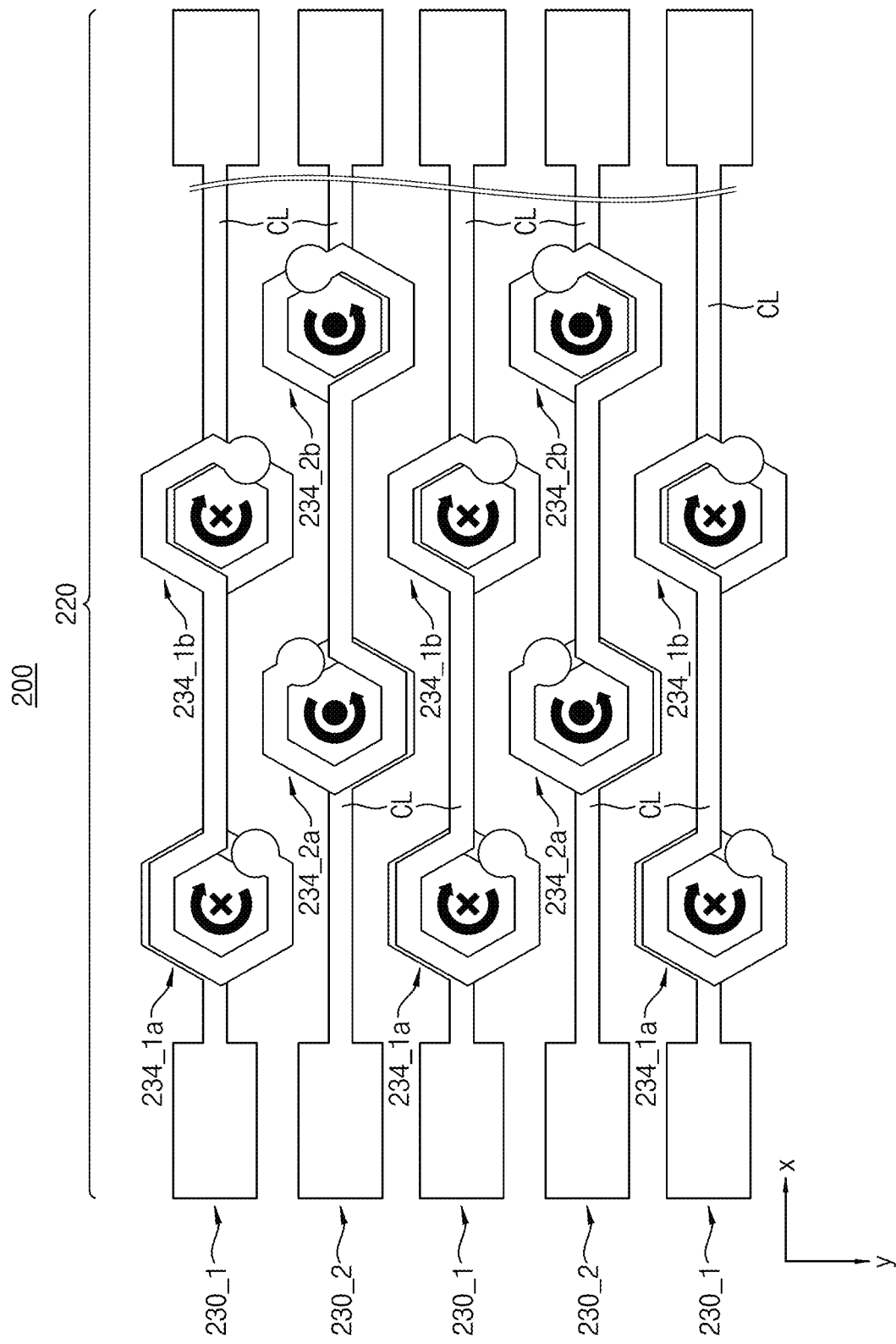
FIG. 7 is a plan view of an inductor array of a semiconductor package according to example embodiments of the inventive concepts.
Figure 8:
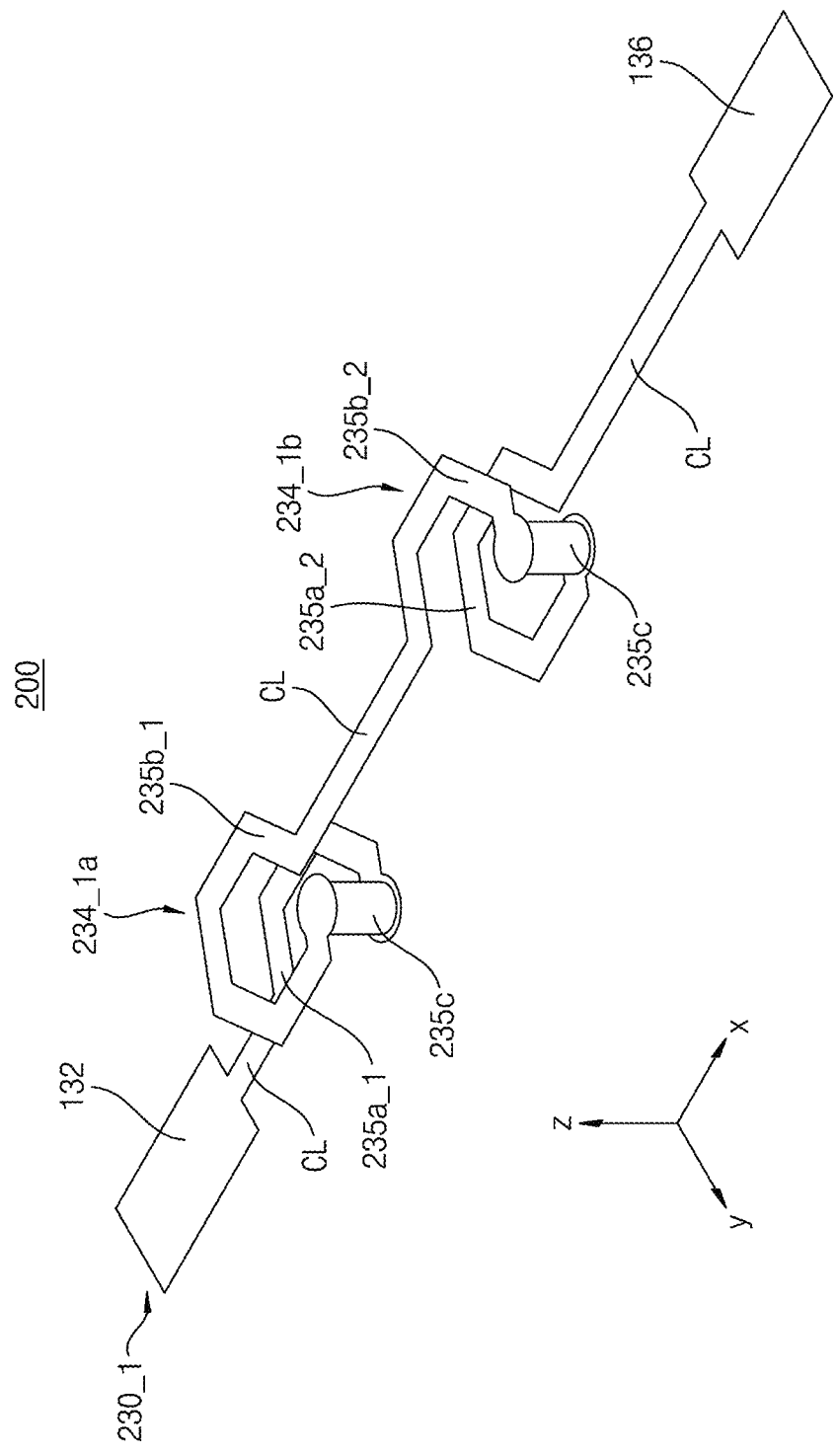
FIG. 8 is a perspective view of the inductor array illustrated in FIG. 7.

FIG. 7 is a plan view of an inductor array of a semiconductor package 200 according to example embodiments of the inventive concepts. FIG. 8 is a perspective view of the inductor array illustrated in FIG. 7.

Referring to FIG. 7, the semiconductor package 200 may include a plurality of first inductor structures 230_1 and a plurality of second inductor structures 230_2. The plurality of first inductor structures 230_1 and the plurality of second inductor structures 230_2 may be apart from one another in a second horizontal direction y and may be alternately arranged in the second horizontal direction y.

Each of the first and second inductor structures 230_1 and 230_2 may include a plurality of coils. In some example embodiments, each of the plurality of first inductor structures 230_1 may include a first coil 234_1a and a second coil 234_1b, which are apart from each other in the first horizontal direction x. Each of the plurality of second inductor structures 230_2 may include a first coil 234_2a and a second coil 234_2b, which are apart from each other in the first horizontal direction x. In some example embodiments, the first coil 234_1a and the second coil 234_1b of each of the plurality of first inductor structures 230_1 may each be a clockwise coil, and the first coil 234_2a and the second coil 234_2b of each of the plurality of second inductor structures 230_2 may each be a counterclockwise coil. Each of the first coils 234_1a and 234_1b may be connected to a conductive wiring CL disposed at a left side, and each of the second coils 234_2a and 234_2b may be connected to a conductive wiring CL disposed at a right side.

Referring to FIG. 8, each of the plurality of first inductor structures 230_1 may include an input terminal 132, an output terminal 136, a first coil 234_1a, a second coil 234_1b, and a plurality of conductive wirings CL connecting the elements. The first coil 234_1a may include a first lower horizontal winding 235a_1, a first upper horizontal winding 235b_1, and a conductive via 235c. The first upper horizontal winding 235b_1 may be disposed on the first lower horizontal winding 235a_1, and the conductive via 235c may connect the first lower horizontal winding 235a_1 to the first upper horizontal winding 235b_1. The first lower horizontal winding 235a_1 may be connected to the input terminal 132 through a corresponding conductive wiring CL.

The second coil 234_1b may include a second lower horizontal winding 235a_2, a second upper horizontal winding 235b_2, and/or a conductive via 235c. The second upper horizontal winding 235b_2 may be disposed on the second lower horizontal winding 235a_2, and the conductive via 235c may connect the second lower horizontal winding 235a_2 to the second upper horizontal winding 235b_2. The second lower horizontal winding 235a_2 may be connected to the output terminal 136 through a corresponding conductive wiring CL. The first upper horizontal winding 235b_1 of the first coil 234_1a may be connected to the second upper horizontal winding 235b_2 of the second coil 234_1b through a corresponding conductive wiring CL extending in the first horizontal direction x. That is, a top surface of the first upper horizontal winding 235b_1 and a top surface of the second upper horizontal winding 235b_2 may be disposed at the same level. In some example embodiments, the first upper horizontal winding 235b_1 and the second upper horizontal winding 235b_2 may be provided as one body. The input terminal 132 and the output terminal 136 may be disposed at the same level. That is, a top surface of the first lower horizontal winding 235a_1 may be disposed at the same level as top surfaces of the input terminal 132, the output terminal 136, and the second lower horizontal winding 235a_2.

In some example embodiments, as seen in a plan view, the first coils 234_1a and 234_2a and the second coils 234_1b and 234_2b may be arranged in zigzags. The first coils 234_1a and 234_2a and the conductive wiring CL may be alternately arranged in the second horizontal direction y, and the second coils 234_1b and 234_2b and the conductive wiring CL may be alternately arranged in the second horizontal direction y. In FIGS. 7 and 8, each of the plurality of first inductor structures 230_1 is illustrated as including two coils, but is not limited thereto. In some example embodiments, each of the first and second inductor structures 230_1 and 230_2 may include three or more coils. As illustrated in FIG. 7, the plurality of first inductor structures 230_1 and the plurality of second inductor structures 230_2 may include a plurality of coils, thereby more effectively decreasing a mutual inductance.

Figure 9:
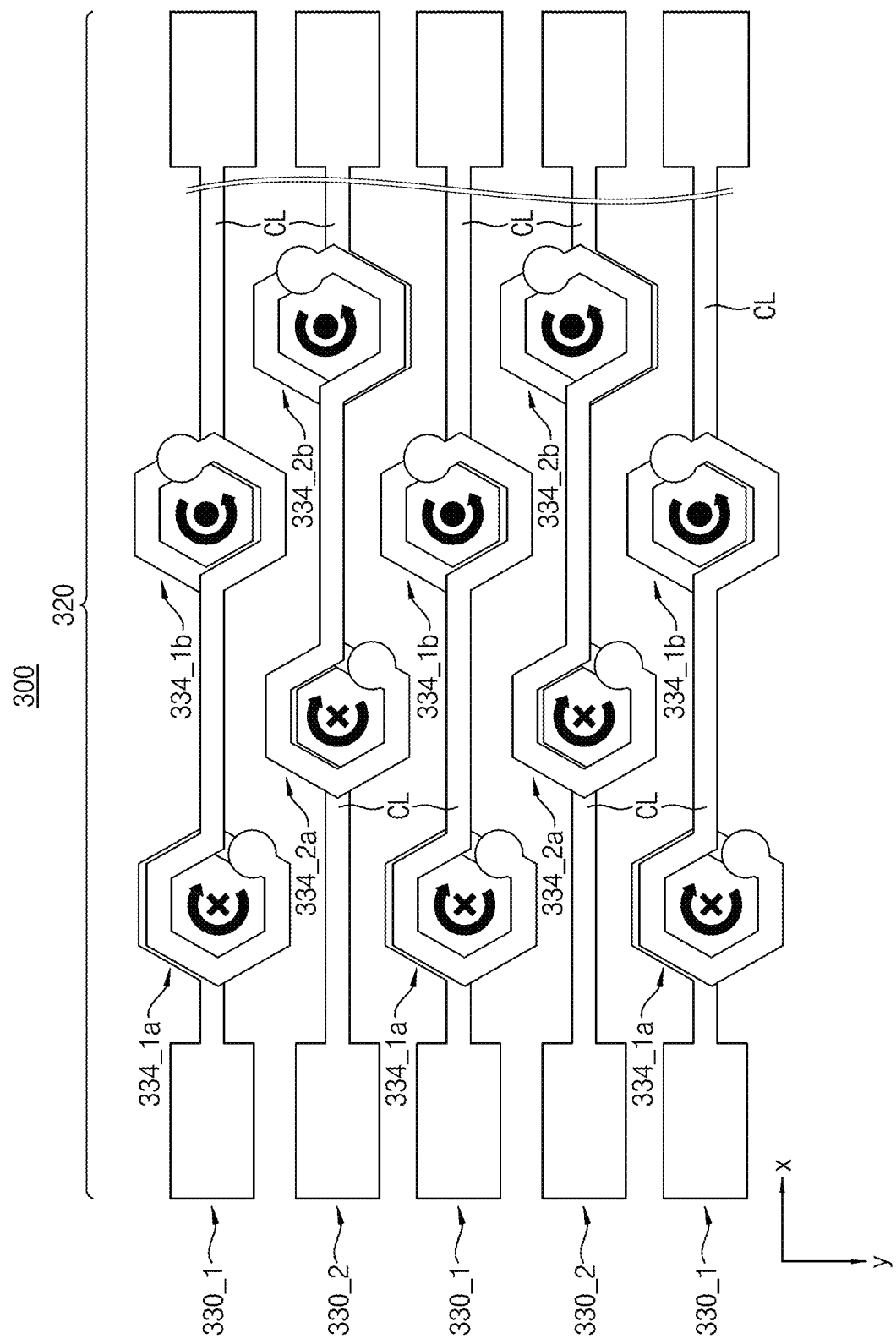
FIGS. 9 to 11 are plan views illustrating an inductor array of a semiconductor package according to example embodiments of the inventive concepts.
Figure 10:
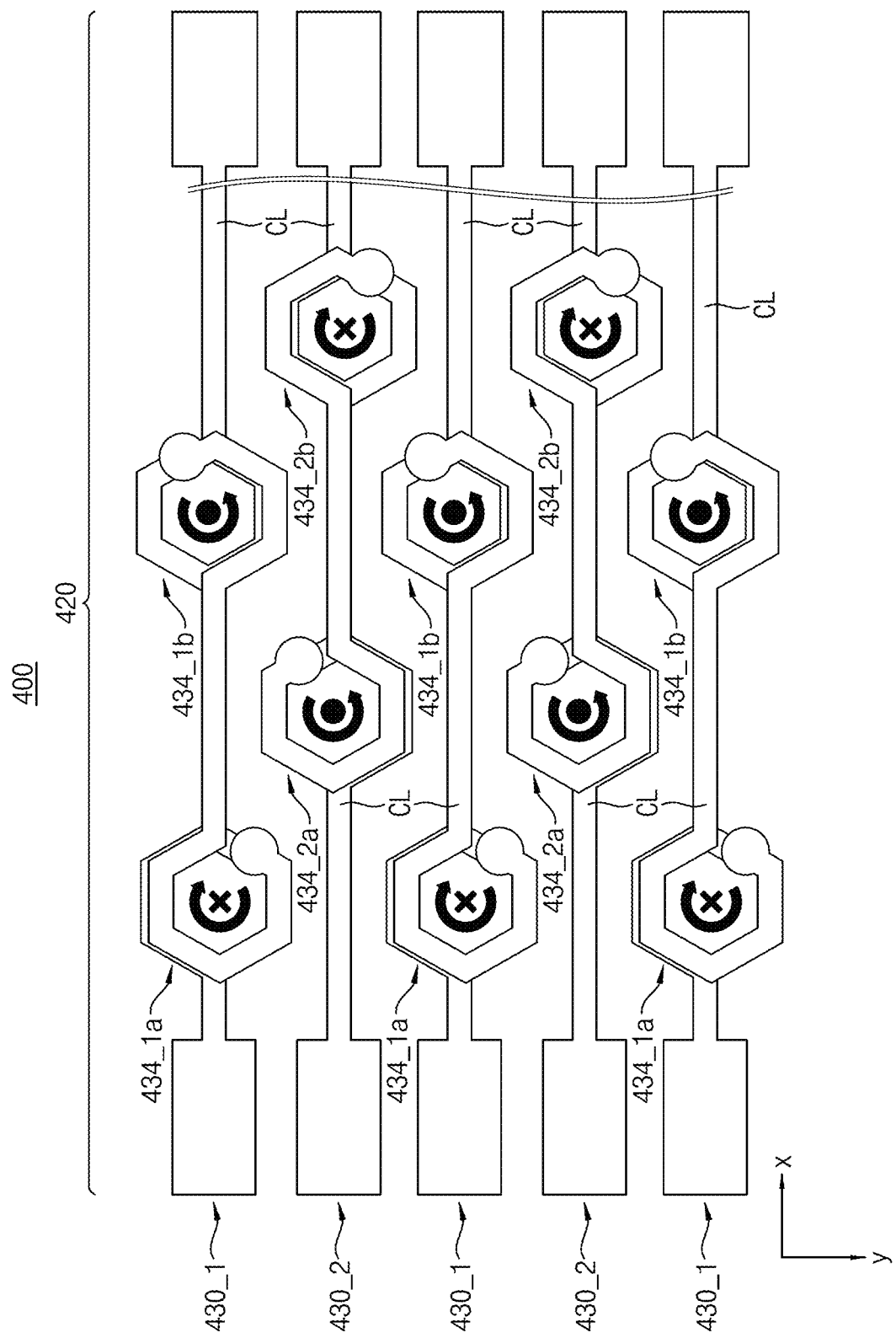
Figure 11:
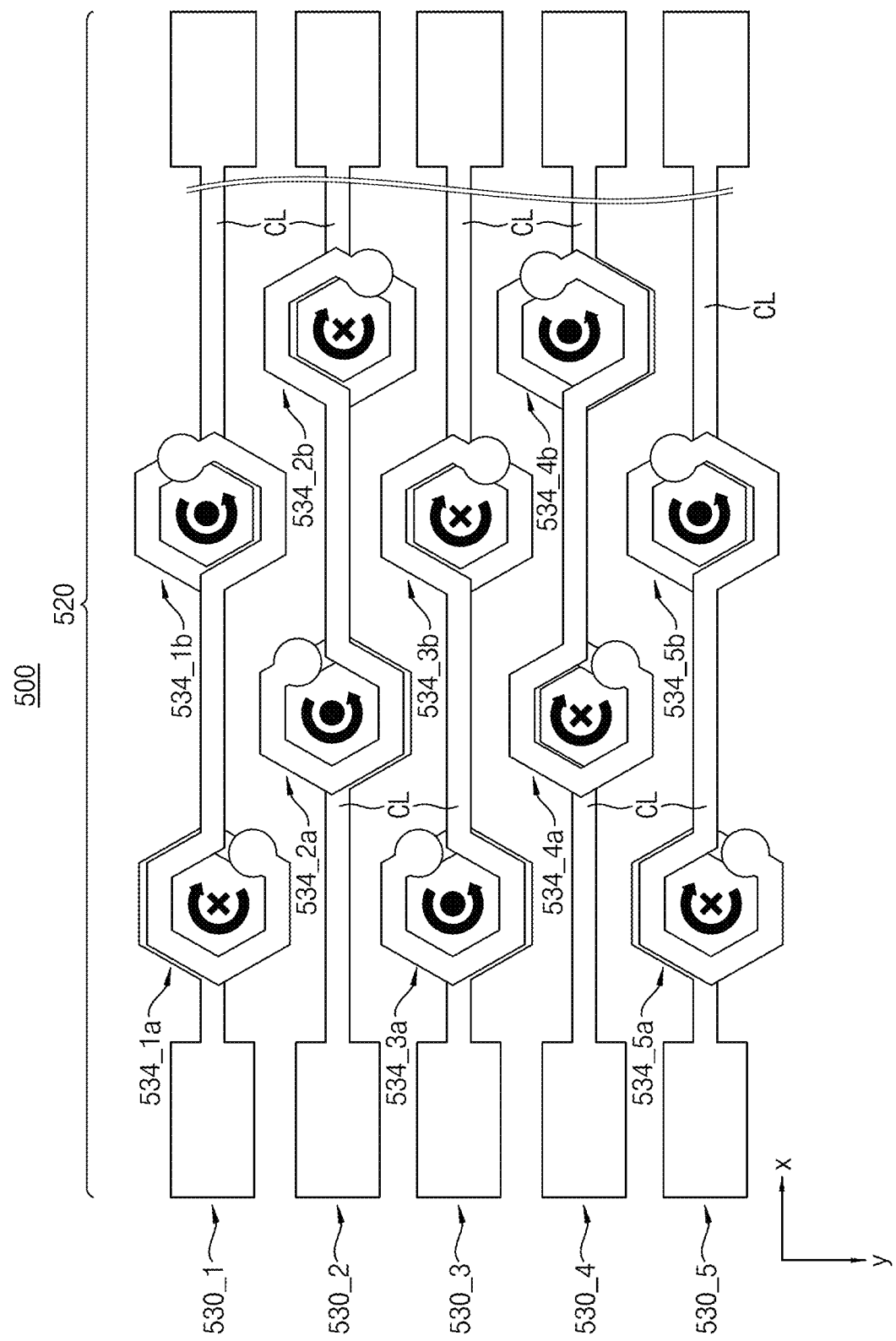

FIGS. 9 to 11 are plan views illustrating an inductor array of a semiconductor package according to example embodiments of the inventive concepts.

Referring to FIG. 9, a semiconductor package 300 according to example embodiments of the disclosure may include a plurality of first inductor structures 330_1 and a plurality of second inductor structures 330_2, which extend in a first horizontal direction x. The plurality of first inductor structures 330_1 and the plurality of second inductor structures 330_2 may be apart from one another in a second horizontal direction y and may be alternately arranged in the second horizontal direction y.

In some example embodiments, each of the plurality of first inductor structures 330_1 may include a first coil 334_1a which is a clockwise coil and a second coil 334_1b which is a counterclockwise coil. Each of the plurality of second inductor structures 330_2 may include a first coil 334_2a which is a clockwise coil and a second coil 334_2b which is a counterclockwise coil. The first coils 334_1a and the second coils 334_1b of the first inductor structures 330_1 and the first coils 334_2a and the second coils 334_2b of the second inductor structures 330_2 may be arranged in zigzags.

Referring to FIG. 10, a semiconductor package 400 according to example embodiments of the disclosure may include a plurality of first inductor structures 430_1 and a plurality of second inductor structures 430_2, which extend in a first horizontal direction x. The plurality of first inductor structures 430_1 and the plurality of second inductor structures 430_2 may be apart from one another in a second horizontal direction y and may be alternately arranged in the second horizontal direction y.

In some example embodiments, each of the plurality of first inductor structures 430_1 may include a first coil 434_1a which is a clockwise coil and a second coil 4341b which is a counterclockwise coil. Each of the plurality of second inductor structures 430_2 may include a first coil 434_2a which is a counterclockwise coil and a second coil 434_2b which is a clockwise coil. The first coils 434_1a and the second coils 434_1b of the first inductor structures 430_1 and the first coils 434_2a and the second coils 434_2b of the second inductor structures 430_2 may be arranged in zigzags.

Referring to FIG. 11, a semiconductor package 500 according to example embodiments of the disclosure may include a first inductor structure 530_1, a second inductor structure 530_2, a third inductor structure 530_3, a fourth inductor structure 530_4, and/or a fifth inductor structure 530_5, which extend in a first horizontal direction x. The first to fifth inductor structures 530_1 to 530_5 may be apart from one another in a second horizontal direction y.

In some example embodiments, the first inductor structure 530_1 may include a first coil 534_1a which is a clockwise coil and a second coil 534_1b which is a counterclockwise coil. The second inductor structure 530_2 may include a first coil 534_2a which is a counterclockwise coil and a second coil 534_2b which is a clockwise coil. The third inductor structure 530_3 may include a first coil 534_3a which is a counterclockwise coil and a second coil 534_3b which is a clockwise coil. The fourth inductor structure 530_4 may include a first coil 534_4a which is a clockwise coil and a second coil 534_4b which is a counterclockwise coil. The fifth inductor structure 530_5 may include a first coil 534_5a which is a clockwise coil and a second coil 534_5b which is a counterclockwise coil. The first coils 534_1a to 534_5a and the second coils 534_1b to 534_5b may be arranged in zigzags.

Figure 12:
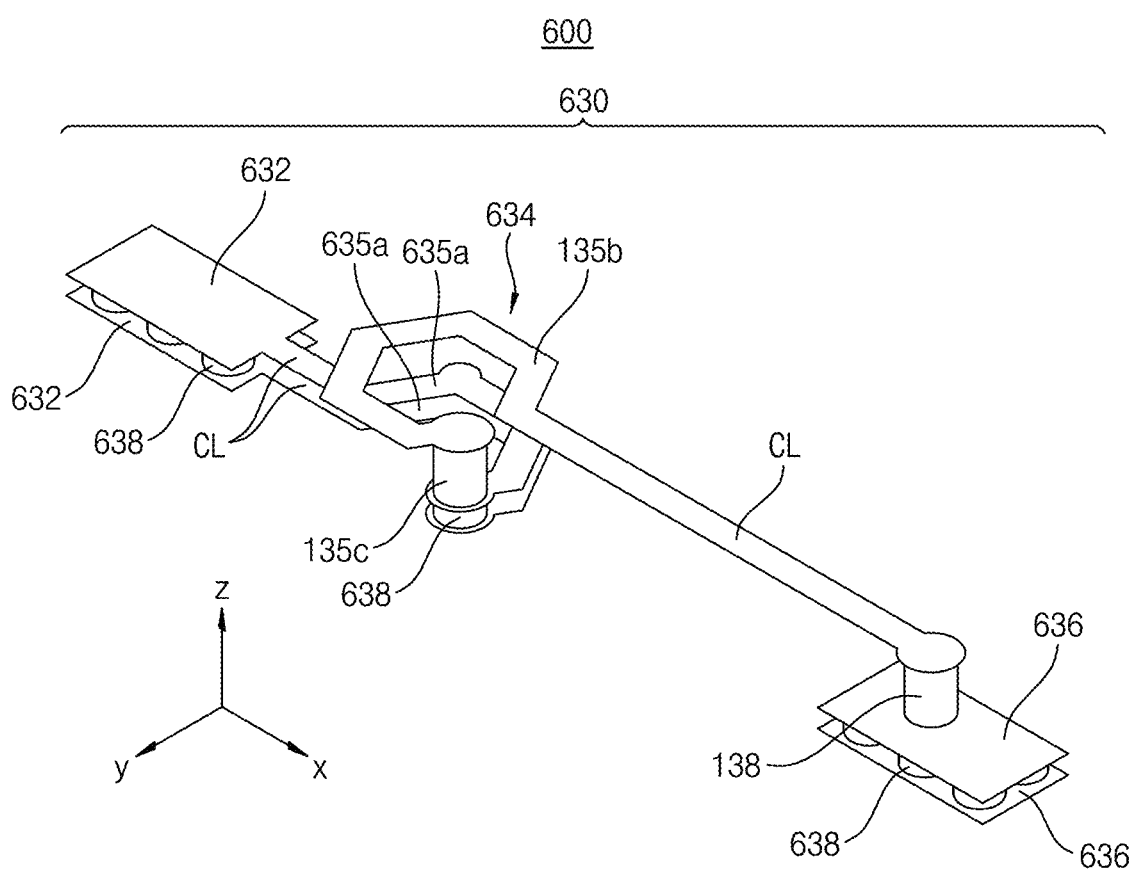
FIG. 12 is a perspective view illustrating an inductor structure of a semiconductor package according to example embodiments of the inventive concepts.

FIG. 12 is a perspective view illustrating an inductor structure of a semiconductor package 600 according to example embodiments of the inventive concepts.

Referring to FIG. 12, the semiconductor package 600 may include an inductor structure 630. The inductor structure 630 may include a plurality of input terminals 632, a coil 634, a plurality of output terminals 636, an output via 138, and/or a plurality of conductive wirings CL. The coil 634 may include a plurality of lower horizontal windings 635a, an upper horizontal winding 635b, and/or a conductive via 635c.

In some example embodiments, the inductor structure 630 may be formed of three layers. For example, the inductor structure 630 may include a plurality of input terminals 632, a plurality of lower horizontal windings 635a, and/or a plurality of output terminals 636, which are apart from one another in a vertical direction z, and the upper horizontal winding 635b may be disposed on each of the plurality of lower horizontal windings 635a. The inductor structure 630 may further include a plurality of connection vias 638 disposed between the plurality of input terminals 632, between the plurality of lower horizontal windings 635a, and between the plurality of output terminals 636. The plurality of connection vias 638 may extend in the vertical direction z and may electrically connect the plurality of input terminals 632, the plurality of lower horizontal windings 635a, and the plurality of output terminals 636. The plurality of conductive wirings CL connecting the plurality of input terminals 632 to the plurality of lower horizontal windings 635a may also have a two-layer structure. As illustrated in FIG. 12, since the semiconductor package 600 includes the plurality of input terminals 632, the plurality of lower horizontal windings 635a, and/or the plurality of output terminals 636, which each have a two-layer structure, and thus, a resistance of the inductor structure 630 may be reduced.

In some example embodiments, the inductor structure 630 may include a plurality of input terminals 632, a plurality of lower horizontal windings 635a, and/or a plurality of output terminals 636, which each have a three or more-layer structure. In some example embodiments, the inductor structure 630 may include an upper horizontal winding 635b having a two-layer structure.

Figure 13:
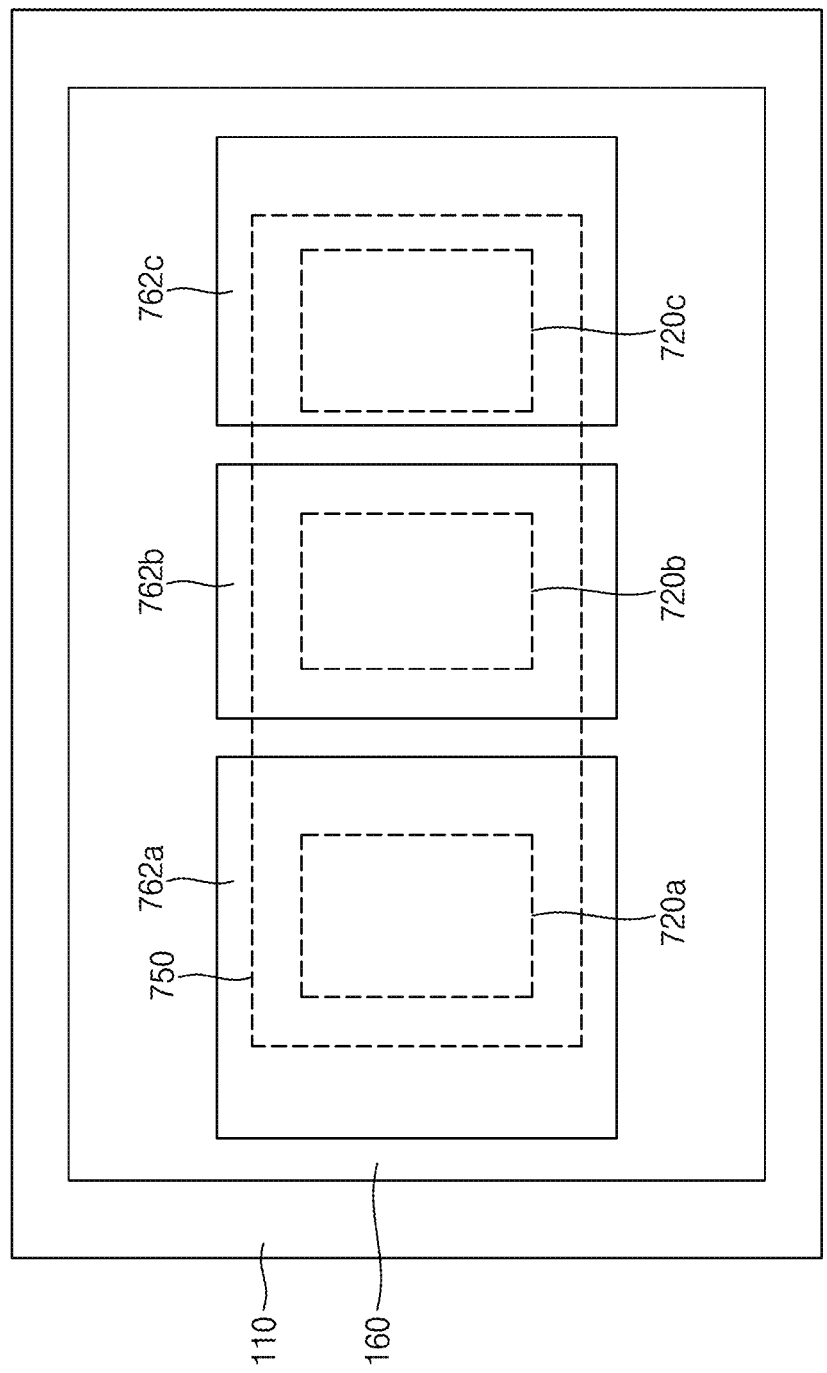

FIGS. 13 and 14 are layouts of a semiconductor package according to example embodiments of the inventive concepts.

Referring to FIG. 13, a semiconductor package 700 according to example embodiments of the disclosure may include a substrate 110, a semiconductor chip 160, a first inductor array 720a, a second inductor array 720b, a third inductor array 720c, a voltage regulator 750, a first core 762a, a second core 762b, and/or a third core 762c. In some example embodiments, the first core 762a, the second core 762b, and/or the third core 762c may respectively be a CPU, a graphics processing unit (GPU), and a neural processing unit (NPU).

The first inductor array 720a, the second inductor array 720b, and/or the third inductor array 720c may be disposed in the substrate 110. The voltage regulator 750 may be disposed under the substrate 110. The first core 762a, the second core 762b, and/or the third core 762c may be disposed in the semiconductor chip 160. The first inductor array 720a, the second inductor array 720b, and/or the third inductor array 720c may respectively correspond to the first core 762a, the second core 762b, and/or the third core 762c. For example, the first core 762a may be electrically connected to the first inductor array 720a and may be supplied with power through the voltage regulator 750 and the first inductor array 720a. The second core 762b may be electrically connected to the second inductor array 720b and may be supplied with power through the voltage regulator 750 and the second inductor array 720b. The third core 762c may be electrically connected to the third inductor array 720c and may be supplied with power through the voltage regulator 750 and the third inductor array 720c.

Referring to FIG. 14, a semiconductor package 800 according to example embodiments of the disclosure may include a substrate 110, a semiconductor chip 160, a first inductor array 820a, a second inductor array 820b, a first voltage regulator 850, a second voltage regulator 851, a first core 862a, a second core 862b, and/or a third core 862c. The first voltage regulator 850 and the first inductor array 820a may correspond to the first core 862a. The second voltage regulator 851 and the second inductor array 820b may correspond to the second core 862b and the third core 862c.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In some embodiments, the neural processing unit (NPU) may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests.

According to example embodiments of the disclosure, an inductor array including an inductor structure may adjust power supplied to a semiconductor chip to be constant.

Hereinabove, the example embodiments of the disclosure have been described with reference to the accompanying drawings, but it may be understood that those skilled in the art may implement the example embodiments in another detailed form without changing the inventive concepts or the essential features. It should be understood that the example embodiments described above are merely examples in all aspects and are not limited.

What is claimed is:

1. A semiconductor package comprising:
a substrate including an inductor array including inductor structures extending in a first horizontal direction; and
a semiconductor chip and a voltage regulator each on the substrate,
wherein each of the inductor structures includes an input terminal, an output terminal, a coil between the input terminal and the output terminal, and conductive wirings connecting the coil to the input terminal and the output terminal,
the inductor structures are apart from one another in a second horizontal direction intersecting with the first horizontal direction,
each of the coils includes a lower horizontal winding wound horizontally, an upper horizontal winding wound horizontally, and a conductive via extending in a vertical direction and connecting the lower horizontal winding to the upper horizontal winding, and
in a plan view, the coils are arranged in zigzags, and the coils and the conductive wirings are alternately arranged in the second horizontal direction.

2. The semiconductor package of claim 1, wherein the upper horizontal winding of each of the coils is on the lower horizontal winding.

3. The semiconductor package of claim 1, wherein a top surface of the lower horizontal winding of each of the coils is at the same level as a top surface of the input terminal.

4. The semiconductor package of claim 1, wherein a top surface of the lower horizontal winding of each of the coils is at the same level as a top surface of the output terminal.

5. The semiconductor package of claim 1, wherein a start portion of the lower horizontal winding is at the same level as an end portion of the lower horizontal winding.

6. The semiconductor package of claim 1, further comprising an output via connecting the output terminal to a conductive wiring connected to the upper horizontal winding among the conductive wirings and extending in the vertical direction.

7. The semiconductor package of claim 1, wherein the conductive via connects an end portion of the lower horizontal winding to a start portion of the upper horizontal winding.

8. The semiconductor package of claim 1, wherein, in a plan view, each of the coils has a hexagonal shape.

9. The semiconductor package of claim 1, wherein
the input terminal, the lower horizontal winding, and the output terminal each have a two-layer structure, and
the semiconductor package further includes a connection via connecting elements of the two-layer structure.

10. The semiconductor package of claim 1, wherein
the coils include a clockwise coil and a counterclockwise coil, and
the clockwise coil and the counterclockwise coil are alternately arranged in the second horizontal direction.

11. The semiconductor package of claim 1, wherein the voltage regulator is configured to adjust power transferred to the semiconductor chip through the inductor array.

12. The semiconductor package of claim 1, wherein
the substrate further includes an internal via connected to the inductor array to extend vertically, and
the semiconductor chip includes a core electrically connected to the inductor array through the internal via.

13. The semiconductor package of claim 1, wherein
the substrate further includes a first inductor array, a second inductor array, and a third inductor array, which are electrically connected to the voltage regulator, and
the semiconductor chip includes a first core electrically connected to the first inductor array, a second core electrically connected to the second inductor array, and a third core electrically connected to the third inductor array.

14. A semiconductor package comprising:
a substrate including an inductor array including first inductor structures and second inductor structures each extending in a first horizontal direction, the first inductor structures and the second inductor structures being apart from one another in a second horizontal direction intersecting with the first horizontal direction;
a semiconductor chip and a voltage regulator each on the substrate,
wherein each of the first inductor structures and the second inductor structures includes an input terminal, an output terminal, a first coil and a second coil between the input terminal and the output terminal, and conductive wirings connecting the first coil, the second coil, the input terminal, and the output terminal,
each of the first coil and the second coil includes a lower horizontal winding wound horizontally, an upper horizontal winding wound horizontally, and a conductive via extending in a vertical direction and connecting the lower horizontal winding to the upper horizontal winding, and
in a plan view, the first coils and the second coils are arranged in zigzags, and the first coils, the second coils, and the conductive wirings are alternately arranged in the second horizontal direction.

15. The semiconductor package of claim 14, wherein top surfaces of the upper horizontal windings of the first coils and the second coils are at the same level.

16. The semiconductor package of claim 14, wherein the first inductor structures and the second inductor structures are alternately arranged in the second horizontal direction.

17. The semiconductor package of claim 16, wherein the first coil and the second coil of each of the first inductor structures are clockwise coils, and the first coil and the second coil of each of the second inductor structures are counterclockwise coils.

18. The semiconductor package of claim 16, wherein the first coil of each of the first inductor structures is a clockwise coil, the second coil of each of the first inductor structures is a counterclockwise coil, the first coil of each of the second inductor structures is a clockwise coil, and the second coil of each of the second inductor structures is a counterclockwise coil.

19. The semiconductor package of claim 16, wherein the first coil of each of the first inductor structures is a clockwise coil, the second coil of each of the first inductor structures is a counterclockwise coil, the first coil of each of the second inductor structures is a counterclockwise coil, and the second coil of each of the second inductor structures is a clockwise coil.

20. A semiconductor package comprising:
  a substrate including lower pads, upper pads, and an inductor array including inductor structures extending in a first horizontal direction;
  a semiconductor chip on the substrate and electrically connected to the upper pads; and
  external connection terminals and a voltage regulator each under the substrate, the external connection terminals being electrically connected to the voltage regulator through the lower pads,
  wherein each of the inductor structures includes an input terminal, an output terminal, a coil between the input terminal and the output terminal, and conductive wirings connecting the coil to the input terminal and the output terminal,
  the inductor structures are apart from one another in a second horizontal direction intersecting with the first horizontal direction,
  each of the coils includes a lower horizontal winding wound horizontally, an upper horizontal winding wound horizontally, and a conductive via extending in a vertical direction and connecting the lower horizontal winding to the upper horizontal winding, and
  in a plan view, the coils are arranged in zigzags, and the coils and the conductive wirings are alternately arranged in the second horizontal direction.

* * * * *